United States Patent
Yamagishi et al.

[11] Patent Number: 5,920,074
[45] Date of Patent: Jul. 6, 1999

[54] THERMOSTAT

[75] Inventors: Shinji Yamagishi, Osaka; Koichi Fujimori, Nabari, both of Japan

[73] Assignee: Sharp Kabushiki Kaisha, Osaka, Japan

[21] Appl. No.: 08/882,240

[22] Filed: Jun. 25, 1997

[30] Foreign Application Priority Data

Jun. 25, 1996 [JP] Japan .................................. 8-164884

[51] Int. Cl.$^6$ .................................................. B41K 1/00
[52] U.S. Cl. ................................................... 250/492.1
[58] Field of Search ........................... 250/492.1, 504 R, 250/492.2, 493.1

[56] References Cited

U.S. PATENT DOCUMENTS

| | | | |
|---|---|---|---|
| 4,568,632 | 2/1986 | Blum et al. | 250/492.1 |
| 5,430,303 | 7/1995 | Matsumoto et al. | 250/492.2 |
| 5,643,801 | 7/1997 | Ishihara et al. | 250/492.1 |
| 5,644,136 | 7/1997 | Kameda et al. | 250/492.1 |
| 5,763,892 | 6/1998 | Kizaki et al. | 250/492.1 |

FOREIGN PATENT DOCUMENTS 7-287241  10/1995  Japan .

*Primary Examiner*—Kiet T. Nguyen
*Attorney, Agent, or Firm*—Dike, Bronstein, Roberts & Cushman, LLP; David G. Conlin

[57] ABSTRACT

A thermostat includes: a processing chamber having a constant temperature maintained inside; a light source device provided at a prescribed position with respect to the processing chamber; and an exposure device directing light emitted from the light source device to a subject placed in the processing chamber.

4 Claims, 8 Drawing Sheets

THERMOSTAT

BACKGROUND OF THE INVENTION

1. Field of the Invention

The present invention relates to a thermostat capable of performing an exposure treatment on a subject while maintaining the subject at a constant temperature. For example, the thermostat can be used in the production of a liquid crystal display device which contains a mixture of a liquid crystal material, a photopolymerizable polymer resin and the like.

2. Description of the Related Art

Conventionally, an exposure apparatus that is employed for producing a liquid crystal display device is used in a step of photolithography, a step of ultraviolet (hereinafter, simply referred to as "UV") cleaning, a step of sealing the panel, or the like. In these steps, it is not necessary to control the temperature of the panel.

Japanese Laid-Open Patent Publication No. 6-230581discloses an exposure apparatus for processing both surfaces of the subject. The exposure apparatus is capable of forming exposed patterns precisely corresponding to patterns of a pair of original films on both surfaces of the subject at the same time.

Recently, a display mode of a liquid crystal display device such as PDLC (Polymer Dispersed Liquid Crystal), which contains a liquid crystal material and a photopolymerizable polymer resin, is receiving much attention as one liquid crystal display modes. FIGS. 7A and 7B are perspective views for illustrating a method for producing a liquid crystal display device 100 having the above-described mode proposed by the present inventors. FIGS. 8A and 8B are perspective views illustrating another method for producing a liquid crystal display device 200 having the above-described mode proposed by the present inventors.

As shown in FIG. 7A, a mixture 113 of a liquid crystal material, a photopolymerizable resin and a photopolymerization initiator is injected between a pair of opposing substrates 101a and 101b. Thereafter, the upper substrate 101a is covered with a photomask 114 having light shielding portions 110 and light transmitting portions 111 such that the light shielding portions 110 cover pixel portions. Then, UV light 108 is radiated toward the mixture 113 through the photomask 114 as represented by allows in FIG. 7A. As a result, as shown in FIG. 7B, the liquid crystal display device 100 is obtained which includes a liquid crystal medium layer having pixel portions irradiated with weaker light being liquid crystal regions 106, where the liquid crystal material concentrates and regions other than the pixel regions irradiated with stronger light being polymer walls 107 where a polymer material concentrates.

According to the production process of the liquid crystal display device 100, the subject needs to be uniformly heated to a temperature equal to or higher than the temperature where the mixture undergoes a phase change to an isotropic phase state during the step of radiating UV light to the subject covered with the above-mentioned photomask, in order to enhance the compatibility of the liquid crystal material and the photopolymerizable resin etc, i.e., in order to enhance the uniformity of the mixture of the liquid crystal material and the photopolymerizable polymer resin etc. Moreover, such a temperature needs to be maintained while radiating the subject with light.

As shown in FIG. 8A, a pair of substrates 201a and 201b included in the liquid crystal display device 200 are provided with transparent electrodes 202a and 202b which hardly transmit light with a certain wavelength. Accordingly, the liquid crystal display device 200 having liquid crystal regions precisely corresponding to the profile of the pixels can be obtained without covering the liquid crystal panel of the liquid crystal display device with a photomask.

Electrodes 202a and 202b on respective substrates 201a and 201b are made of a material that hardly transmits UV light and patterned in a striped manner. The pair of substrates 201a and 201b are attached with each other such that the intersections of the electrodes 202a and 202b are arranged in a matrix. Then, the above-mentioned mixture is injected between the pair of substrates 201a and 201b, thereby forming the liquid crystal cell 200. Thereafter, the surfaces of the liquid crystal cell 200 are irradiated with UV light 208, the radiation being applied either one surface at a time or simultaneously. As a result, the regions irradiated with weaker light corresponding to pixel regions become the liquid crystal regions 106 where the liquid crystal material concentrates and the regions other than the pixel regions, which are irradiated with stronger light, become the polymer walls 107 where the polymer material concentrates (Japanese Laid-Open Patent Publication No. 7-287241). Thus, a liquid crystal display device 200 having the liquid crystal medium layer is completed.

According to the above-described method for producing the liquid crystal display device, the temperature of the liquid crystal cell needs to be maintained constant during the light radiation process. Conventionally, the light radiation treatment is performed on one surface of the subject at a time while maintaining the subject on a hot plate and, when necessary, covering an upper surface of the subject with a photomask.

However, in such a case, the upper surface of the substrate is directly exposed to the outside air, which is at a lower temperature, and thus maintaining the uniform temperature of the entire substrate is difficult. When the exposure treatment is performed in such a state, it is difficult to realize a desired phase separation. Further, there is a problem of display defects due to the uneven temperature of the surface of the subject.

Moreover, since the exposure treatment is performed on one surface of the subject at a time, there is a problem of low production efficiency.

Japanese Laid-Open Patent Publication No. 6-230581 discloses an exposure apparatus capable of exposing both surfaces of the subject at the same time. However, the above-mentioned exposure apparatus is not able to heat the subject and thus, producing the above-described display device in a satisfactory manner is very difficult.

SUMMARY OF THE INVENTION

According to one aspect of this invention, a thermostat includes: a processing chamber having a constant temperature maintained inside; a light source device provided at a prescribed position with respect to the processing chamber; and an exposure device directing light emitted from the light source device to a subject placed in the processing chamber.

In one embodiment of the present invention, the light source device includes a pair of light sources arranged so as to oppose a top surface and a bottom surface of the subject placed in the processing chamber. The exposure device collimates light emitted from each of the pair of light sources so as to radiate collimated light to the top surface and the bottom surface of the subject.

In another embodiment of the present invention, the light source device includes a pair of light sources arranged so as to oppose a top surface and a bottom surface of the subject placed in the processing chamber. The exposure device converts light emitted from each of the pair of light sources into scattered light so as to radiate scattered light to the top surface and the bottom surface of the subject.

In still yet another embodiment of the present invention, the exposure device includes a light dividing device. The dividing device divides the light emitted from the light source into two light beams so as to radiate the two divided light beams to a top surface and a bottom surface of the subject placed in the processing chamber.

In still yet another embodiment of the present invention, a thermostat includes a subject carrying apparatus for sequentially introducing the subject into the processing chamber and sequentially carrying out the subject processed in the processing chamber from the processing chamber.

In still yet another embodiment of the present invention, the light source device emits ultraviolet light.

In still yet another embodiment of the present invention, a thermostat further includes a cooling device. The cooling device gradually cools the subject processed in the processing chamber.

In still yet another embodiment of the present invention, a thermostat further includes a filter controlling intensity of light and wavelength of light. The exposure device directs light emitted from the light source device to the subject placed in the processing chamber via the filter.

Thus, the invention described herein makes possible the advantages of providing a thermostat to be used during a process of producing a liquid crystal display device containing a mixture of a liquid crystal material and a photopolymerizable polymer resin, the thermostat being capable of performing an exposure treatment on a subject and capable of controlling display defects caused by the uneven temperature of the surface of the subject.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. It is noted that the present invention is not limited to the structures described in the examples by any means.

EXAMPLE 1

Figure 1:
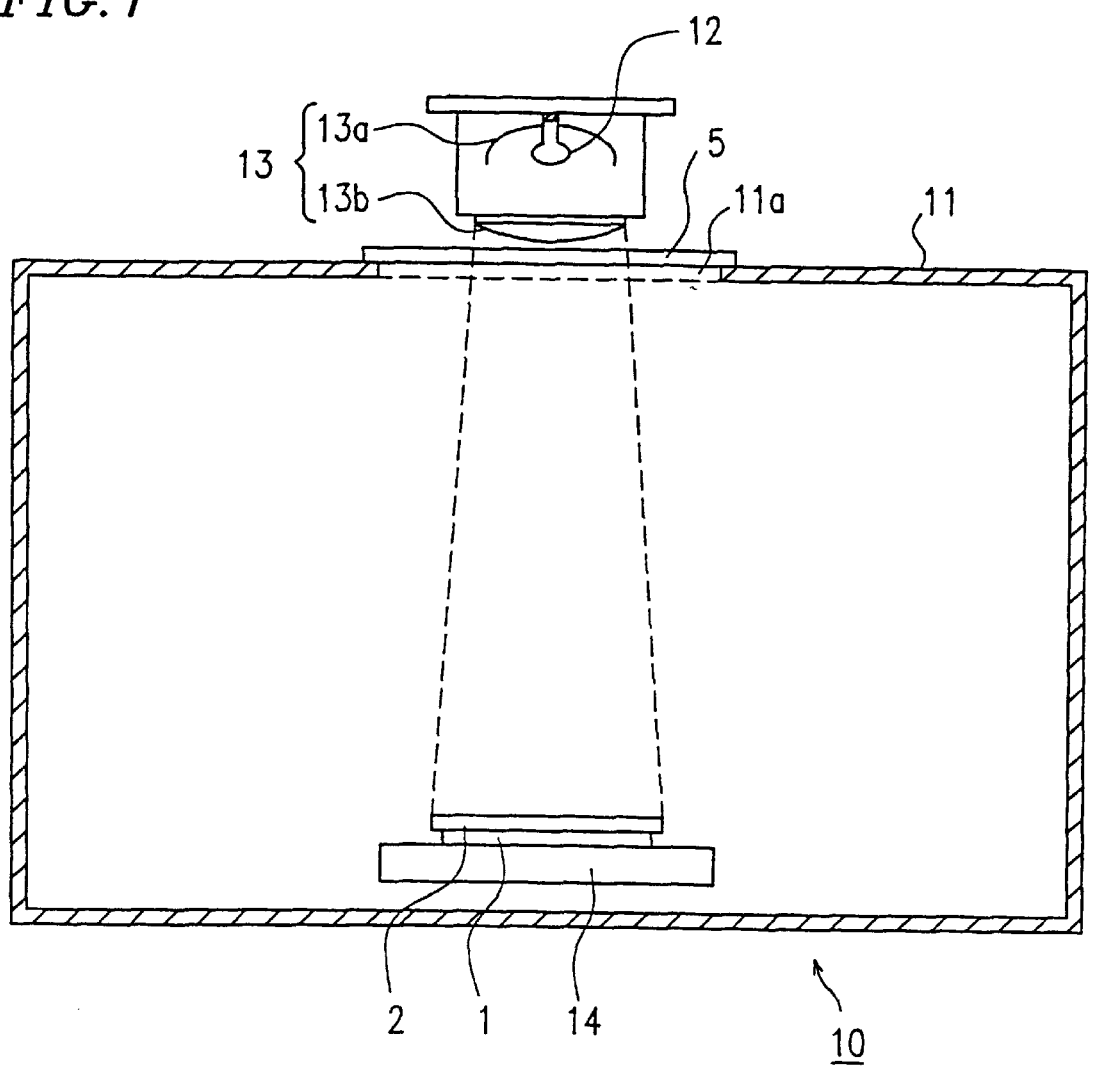
FIG. 1 is a cross-sectional view showing one type of thermostat having an exposure mechanism according to a first example of the present invention.

FIG. 1 is a cross-sectional view showing a thermostat 10 having an exposure mechanism according to a first example of the present invention. Herein, components having substantially like functions and effects are denoted by the same reference numerals, and the description thereof is omitted.

With reference to FIG. 1, the thermostat 10 having the exposure mechanism according to the first example of the present invention includes a processing chamber 11 which is made to maintain a constant temperature inside, a lamp 12 provided above the processing chamber 11 for emitting light for exposure and an exposure device 13 for directing light emitted from the lamp 12 to a subject 1 placed in the processing chamber 11.

The temperature inside the processing chamber 11 can be set to a prescribed temperature. Preferably, the prescribed temperature can be selected from a wide range of temperature. The range of the temperature is preferably about 0° C. to 120° C. Specifically, a heater or the like is provided so as to maintain a constant temperature of the atmosphere inside the processing chamber 11. Moreover, a light transmitting opening 11a is formed in a top wall of the processing chamber 11 where it opposes the lamp 12. A support table 14 for maintaining the subject 1 is provided right below the light transmitting opening 11a. The exposure device 13 includes a reflecting plate 13a arranged at the back of the lamp 12 and an optical component such as a lens 13b for collecting light and directing the collected light to the subject 1, the light being emitted from the lamp 12 and reflected off the reflection plate 13a.

In the thermostat 10 having such a structure, the subject 1 (for example, a liquid crystal cell including a pair of substrates with a mixture of a liquid crystal material and a photopolymerizable polymer resin etc., injected therebetween) is placed on the support table 14 in the processing chamber 11. Then, while maintaining a constant temperature of the liquid crystal cell 1, light for exposure emitted from the lamp 12 is radiated to the liquid crystal cell 1 via the light transmitting opening 11a. When necessary, a photomask 2 is provided on the liquid crystal cell 1.

Accordingly, exposure treatment to the liquid crystal cell 1 can be performed, while maintaining the temperature of the liquid crystal cell 1.

EXAMPLE 2

Figure 2:
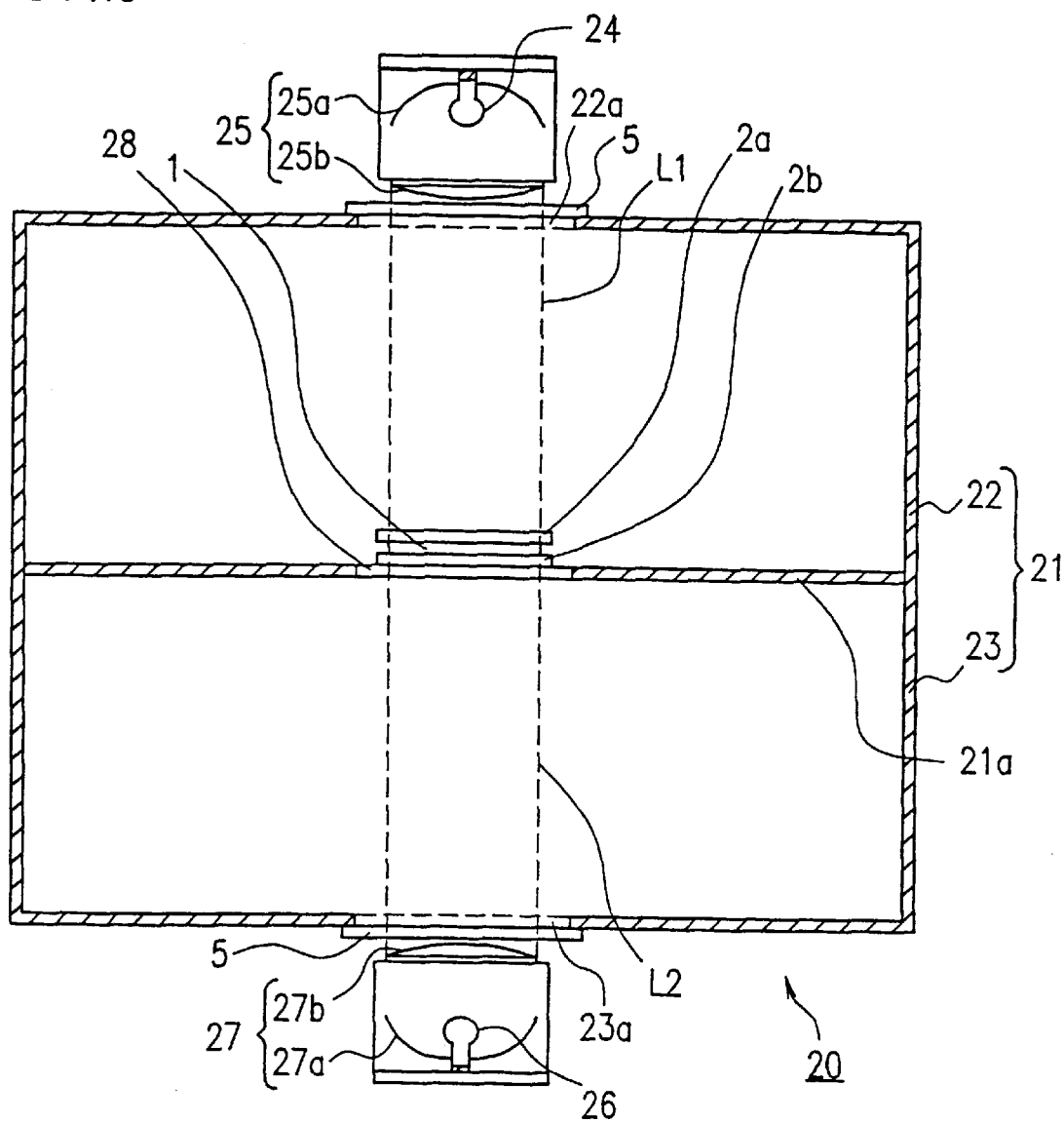
FIG. 2 is a cross-sectional view showing another type of thermostat having an exposure mechanism according to a second example of the present invention.

FIG. 2 is a cross-sectional view showing a thermostat 20 having an exposure mechanism according to a second example of the present invention.

With reference to FIG. 2, the thermostat 20 having the exposure mechanism for radiating collimated light according to the second example of the present invention includes a processing chamber 21 which is made to maintain a constant temperature inside. The processing chamber 21 is partitioned into upper and lower regions 22 and 23 by a partition plate 21a. The temperature inside the processing chamber 21 can be set to a prescribed temperature as the processing chamber 11 according to the first example.

Preferably, the prescribed temperature can be selected from a wide range of temperatures. The range of the temperature is preferably about 0° C. to 120° C. Specifically, a heater or the like is provided so as to maintain a constant temperature of the atmosphere inside the processing chamber 21.

A center portion of the partition plate 21a consists of a transparent plate 28 where a subject 1 can be placed. In the second example, the subject (a liquid crystal cell) 1 is placed on the transparent plate 28 via a photomask 2b. The subject 1 is further covered with a photomask 2a.

A light transmitting opening 22a is formed in a portion of the top wall of the upper region 22 of the processing chamber 21, where it oppose the transparent plate 28. A lamp 24 for emitting light for exposure and an exposure device 25 for directing the light emitted from the lamp 24 toward the subject 1 placed in the processing chamber 21 are arranged above the light transmitting opening 22a.

The exposure device 25 includes a reflecting plate 25a arranged at the back of the lamp 24 and an optical component such as a lens 25b for collimating the light from the lamp 24 and reflected off the reflecting plate 25a and directing the collimated light L1 to the subject 1.

A light transmitting opening 23a is formed in a portion of the bottom wall of the lower region 23 of the processing chamber 21, where it opposes the transparent plate 28. A lamp 26 for emitting light for exposure and an exposure device 27 for directing the light emitted from the lamp 26 toward the subject 1 placed in the processing chamber 21 are arranged below the light transmitting opening 23a.

The exposure device 27 includes a reflecting plate 27a arranged at the back of the lamp 26 and an optical component such as a lens 27b for collimating the light which is emitted from the lamp 26 and reflected off the reflecting plate 27a, and directing collimated light L2 toward the subject 1.

According to the second example of the present invention, since the light sources, i.e., the lamps, 24 and 26 are arranged so as to face the top and the bottom surfaces of the subject (the liquid crystal cell) 1, both top and bottom surfaces of the subject 1 can be simultaneously exposed to the light. Thus, production efficiency of liquid crystal display devices can be greatly enhanced. Furthermore, light for exposure emitted from each of the light sources 24 and 26 is collimated, and then the collimated light L1 and L2 are directed toward the surfaces of the subject 1. Accordingly, a liquid crystal display device having polymer walls with matrix configuration thereof precisely corresponding to the profile of pixel portions can be obtained.

EXAMPLE 3

Figure 3:
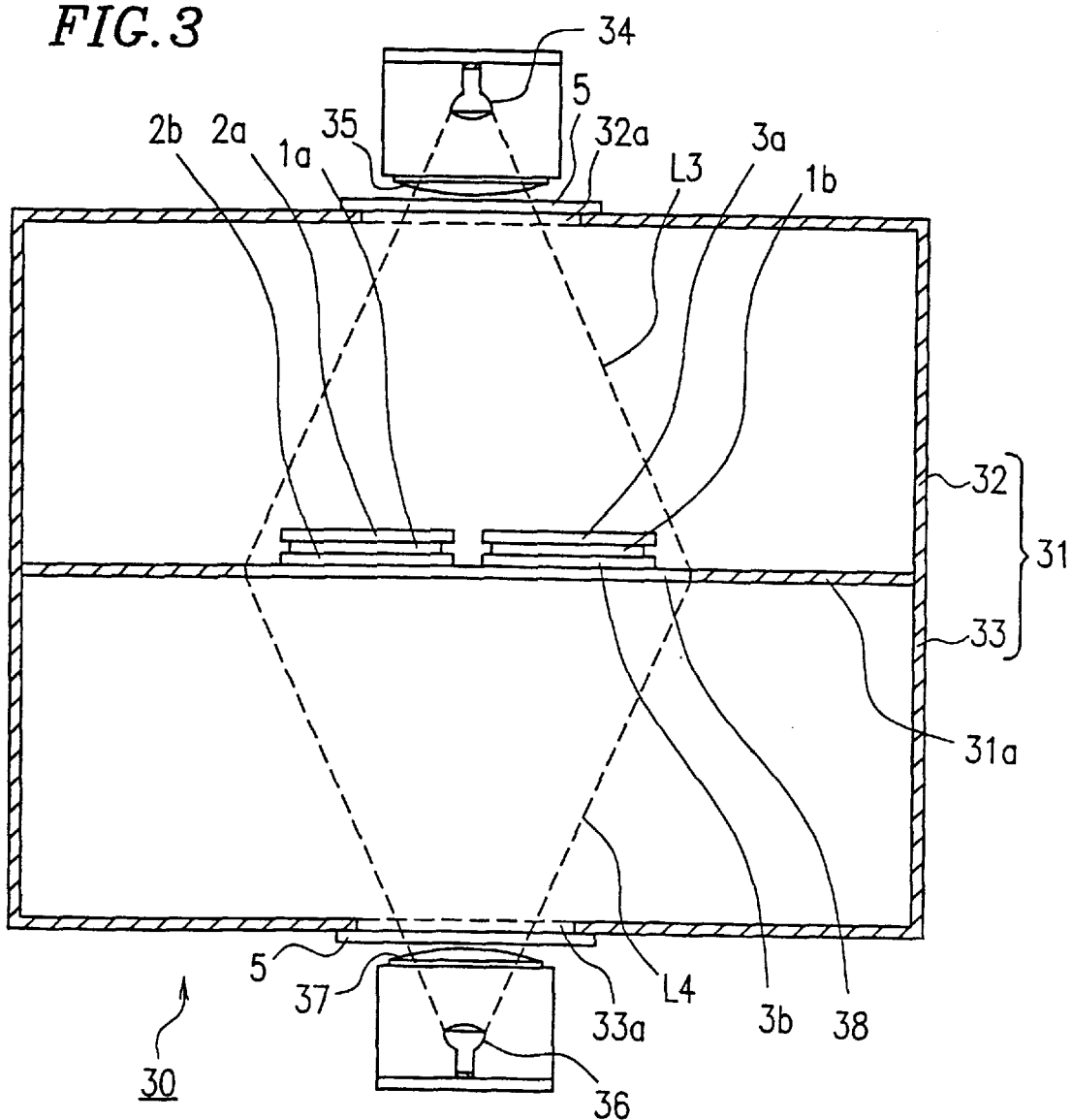
FIG. 3 is a cross-sectional view showing another type of thermostat having an exposure mechanism according to a third example of the present invention.

FIG. 3 is a cross-sectional view showing a thermostat 30 having an exposure mechanism according to a third example of the present invention.

With reference to FIG. 3, the thermostat 30 includes an exposure mechanism for radiating scattered light and a processing chamber 31 which is made to maintain a constant temperature inside. The processing chamber 31 is partitioned into upper and lower regions 32 and 33 by a partition plate 31a. The temperature inside the processing chamber 31 can be set to a prescribed temperature as the processing chamber 11 according to the first example. Preferably, the prescribed temperature can be selected from a wide range of temperatures. The range of the temperature is preferably about 0° C. to 120° C. Specifically, a heater or the like is provided so as to maintain a constant temperature of the atmosphere inside the processing chamber 31.

A center portion of the partition plate 31a consists of a transparent plate 38 where two subjects 1a and 1b can be placed. In the third example, the subjects (liquid crystal cells) 1a and 1b are placed on the transparent plate 38 via photomasks 2b and 3b so as to be adjacent to each other and covered with upper photomasks 2a and 3a, respectively.

A light transmitting opening 32a which is smaller than the transparent plate 38 is formed in a portion of the top wall of the upper region 32 of the processing chamber 31, where it opposes the transparent plate 38. A lamp 34 for emitting light for exposure and an exposure device for directing the light emitted from the lamp 34 toward the subjects 1a and 1b placed in the processing chamber 31 are provided above the light transmitting opening 32a.

The exposure device includes an optical component such as a lens 35 for converting the light emitted from the lamp 34 into scattered light L3 and directing the scattered light L3 to the subjects 1a and 1b.

A light transmitting opening 33a which is smaller than the transparent plate 38 is formed in a portion of the bottom wall of the lower region 33 of the processing chamber 31, where it opposes the transparent plate 38. A lamp 36 for emitting light for exposure and an exposure device for directing the light emitted from the lamp 36 toward the subjects 1a and 1b placed in the processing chamber 31 are provided below the light transmitting opening 33a.

The exposure device includes an optical component such as a lens 37 for converting the light emitted from the lamp 36 into scattered light L4 and directing the scattered light L4 to the subjects 1a and 1b.

According to the third example of the present invention, the pair of light sources, i.e., lamps, 34 and 36 for exposure are arranged so as to oppose both surfaces of each of the subjects 1a and 1b placed in the processing chamber 31. The light for exposure emitted from each of the light sources 34 and 36 are converted into the scattered light L3 and L4. The scattered light L3 and L4 are directed to both surfaces of each of the subjects 1a and 1b. Accordingly, both surfaces of the subjects 1a and 1b can be simultaneously exposed to the light.

EXAMPLE 4

Figure 4:
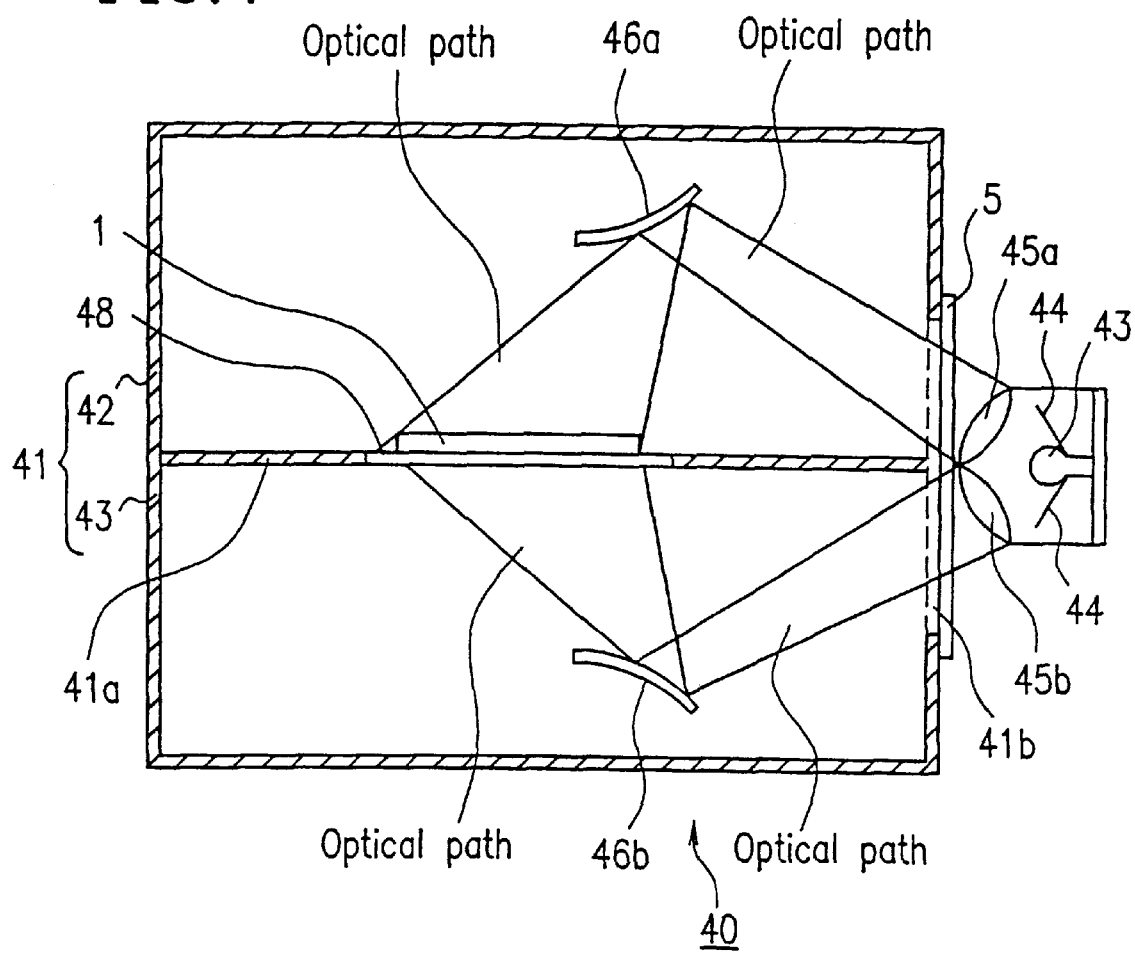
FIG. 4 is a cross-sectional view showing another type of thermostat having an exposure mechanism according to a fourth example of the present invention.

FIG. 4 is a cross-sectional view showing a thermostat 40 having an exposure mechanism according to a fourth example of the present invention.

The thermostat 40 has the exposure mechanism which divides light emitted from one light source into two light beams and directs the divided light beams toward both surfaces of a subject 1. The thermostat 40 includes a processing chamber 41 which is made to maintain a constant temperature inside. The processing chamber 41 is partitioned into upper and lower regions 42 and 43 by a partition plate 41a.

The temperature inside the processing chamber 41 can be set to a prescribed temperature as the processing chamber 11 according to the first example. Preferably, the prescribed temperature can be selected from a wide range of temperatures. The range of the temperature is preferably about 0° C. to 120° C. Specifically, a heater or the like is provided so as to maintain a constant temperature of the atmosphere inside the processing chamber 41.

A center portion of the partition plate 41a consists of a transparent plate 48 where the subject 1 can be placed. In the fourth example, a liquid crystal cell 1 is placed on the transparent plate 48 as the subject 1.

A light transmitting opening 41b is formed in one of the side walls of the processing chamber 41. A lamp 43 for emitting light for exposure is provided in close proximity to the light transmitting opening 41b. A reflecting plate 44 is arranged at the back of the lamp 43. Lenses 45a and 45b are arranged so as to correspond to the upper and the lower regions 42 and 43 of the processing chamber 41, respectively. Reflecting mirrors 46a and 46b are provided in the regions 42 and 43, respectively. The light emitted from the lamp 43 is collected by the lenses 45a and 45b. The collected light beams are reflected by the reflecting mirrors 46a and 46b so as to be directed to the subject 1. In the fourth example, the exposure device, which directs light for exposure emitted from the lamp 43 toward the subject 1, includes the reflecting plate 44, the lenses 45a and 45b and optical components such as reflecting mirrors 46a and 46b.

According to the fourth example of the present invention, the light for exposure emitted from the light source 43 is divided into two light beams and the divided light beams are radiated on both surfaces of the subject 1. Accordingly, both surfaces of the subject 1 can be simultaneously exposed. As a result, production efficiency of liquid crystal display devices can be enhanced and the number of lamps enabling both surfaces of the subject 1 to be exposed can be reduced. Consequently, the cost of the processing apparatus can be reduced.

According to the above-described examples, various types of lamps, for example, an UV lamp, can be used. The shape of the lamp may be, for example, a sphere or a stick. Furthermore, a plurality of lamps may be provided for one light transmitting opening. Alternatively, the lamp may be provided inside the processing chamber.

Moreover, the light transmitting opening or the lens in the above-described examples may be provided with a filter 5 for controlling the light intensity and the wavelength. The filter 5 may be provided between the light transmitting opening and the lens so that light for exposure emitted from the light source may be radiated toward the subject placed in the processing chamber via the filter 5. Accordingly, the reaction rate of the photopolymerizable resin can be adjusted, and thus a liquid crystal display device having a high display quality can be produced.

The lamp and the exposure device may be formed so as to be movable with respect to the processing chamber. At the same time, the support table for the subject or the support portion for the subject may also be movable with respect to the processing chamber. Accordingly, a plurality of subjects can be exposed while being carried.

The above-described processing chamber may optionally be provided with a cooling function for gradually cooling the temperature of the subject. The cooling function may be realized by providing, for example, a heater controlling circuit which gradually reduces the carolific value of the above-mentioned heater for heating the subject.

EXAMPLE 5

Figure 5:
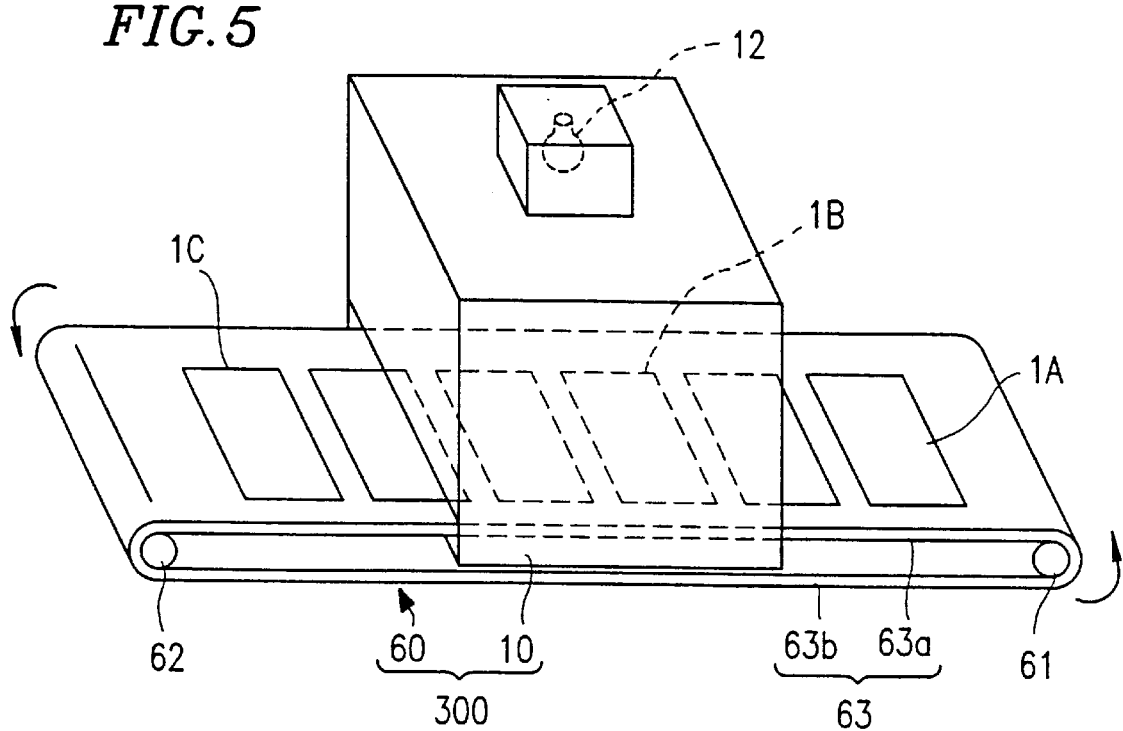
FIG. 5 is a perspective view showing one type of thermostat system according to a fifth example of the present invention.

FIG. 5 is a cross-sectional view showing a thermostat system 300 according to a fifth example of the present invention.

The thermostat system 300 is obtainable by combining a carrying apparatus 60 with the thermostat 10 according to the first example of the present invention. The thermostat system 300 according to the fifth example of the present invention is not limited to include the thermostat 10 according to the first example and may include any one of the thermostats 20, 30 and 40 according to the second, third and fourth examples.

The above-mentioned carrying apparatus 60 includes movable rollers 61 and 62 arranged on a subject introducing side and a subject exiting side, respectively. An endless film sheet 63 made of a transparent material extends between the movable roller 61 and 62. The upper portion 63a of the endless film sheet 63 runs through the processing chamber of the thermostat 10 and the lower portion 63b runs outside of the processing chamber of the thermostat 10. A subject 1A before being exposed, a subject 1B being exposed and a substrate 1C after being exposed are shown in FIG. 5.

In the case of the thermostat system 300, the subjects 1 are placed on the film sheet 63 and sequentially carried into the processing chamber of the thermostat 10. Thus, the time and trouble expended in replacing the subjects in the processing chamber, can be minimized. As a result, production efficiency can be greatly enhanced.

Figure 6:
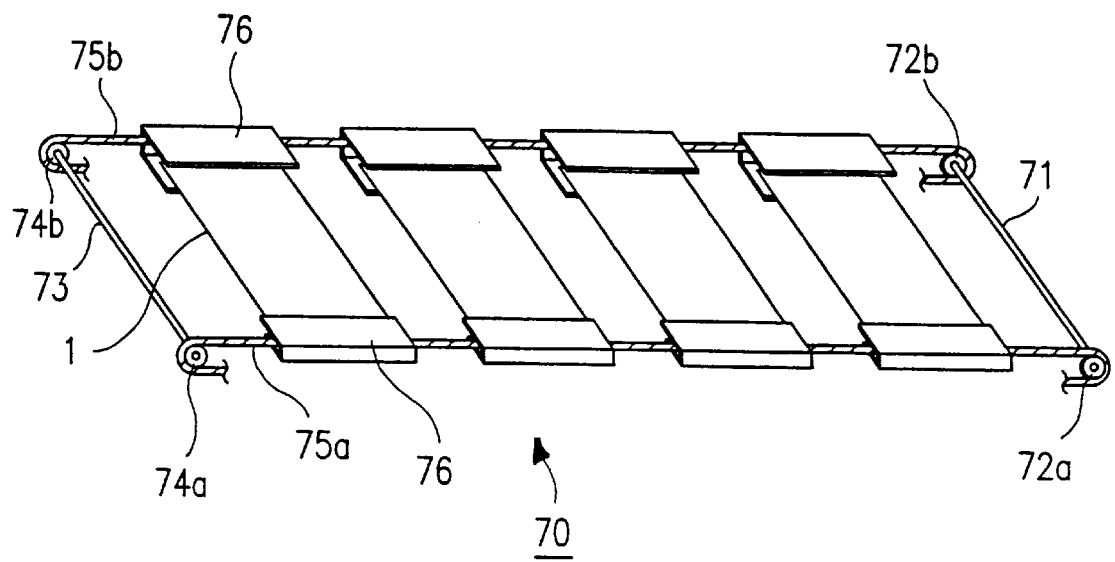
FIG. 6 is a perspective view showing another type of thermostat system according to a fifth example of the present invention.

The carrying apparatus according to the fifth example consists of the movable rollers 61 and 62 and the endless film sheet 63. However, the present invention is not limited thereto. For example, a carrying apparatus 70 shown in FIG. 6 may be employed.

The carrying apparatus 70 includes rotation shafts 71 and 73 provided at the both ends of the carrying apparatus 70. Sprockets 72a and 72b are mounted on both ends of the rotation shaft 71 on the subject introducing side. Sprockets 74a and 74b are mounted on both ends of the rotation shaft 73 on the subject exiting side. Endless chains 75a and 75b extend between the corresponding rotation shafts 71 and 73.

Subject supporting frames 76 for maintaining the subjects 1 are attached to the endless chains 75a and 75b at regular intervals. The subject supporting frames 76 are formed of a flexible material which is deformable at the turning point of the sprockets 74a and 74b and at the turning point of the sprockets 72a and 72b.

Figure 8A:
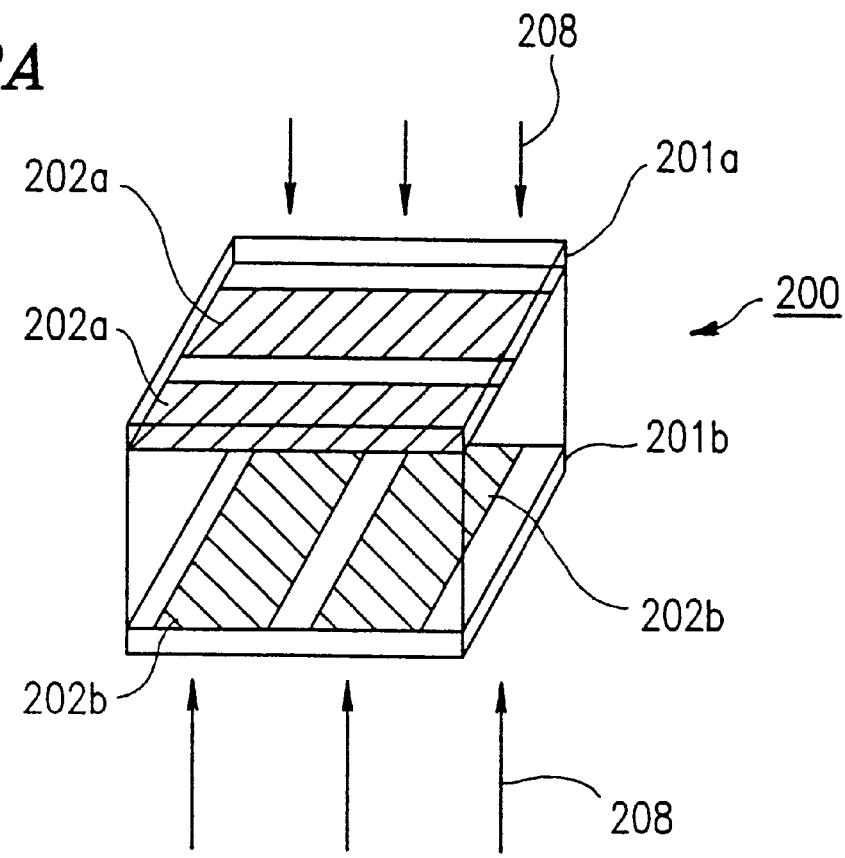
FIGS. 8A and 8B are perspective views illustrating another method for producing a liquid crystal display device.
Figure 8B:
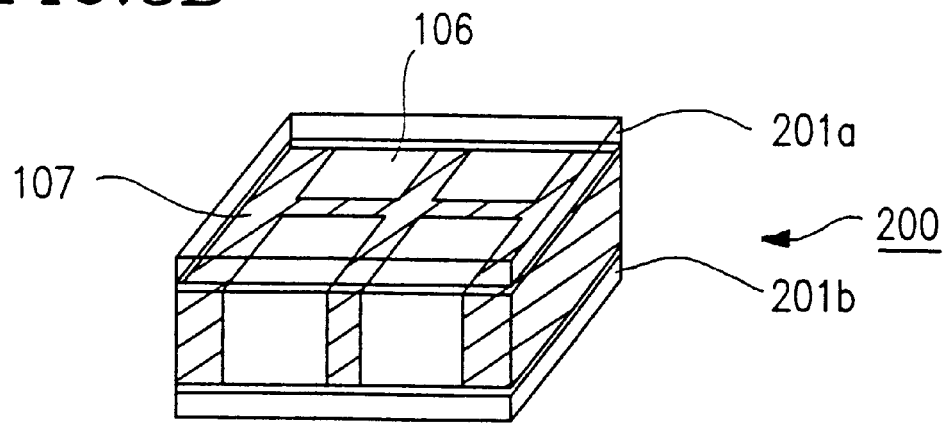

Hereinafter, a method for performing exposure treatment on a liquid crystal cell, illustrated in FIGS. 8A and 8B, by using the thermostat 20 according to the second example (FIG. 2) will be described.

According to this method, two UV lamps, which have a peak wavelength in the vicinity of 365 nm and a maximum radiant intensity of 50 mW/cm$^2$ at the wavelength of 365 nm, are provided at the upper and lower portion of the processing chamber 21.

Firstly, a mixture of a liquid crystal material, a photopolymerizable resin and a photopolymerization initiator is injected between a pair of substrates having striped transparent electrodes 202a and 202b formed thereon. The transparent electrodes 202a and 202b hardly transmit light having a wavelength in the vicinity of that of UV light.

Then, the temperature inside the processing chamber 21 is maintained at a temperature of 100° C. A subject 1 is placed in the processing chamber 21 of the thermostat 20 shown in FIG. 2 and left therein for about 30 minutes so as to maintain a uniformly distributed temperature of the subject 1. When the temperature of the surface of the subject at prescribed positions was monitored with a thermocouple after about 30 minutes, the temperature of the entire surface of the subject 1 was approximately 100° C.

Thereafter, the upper and the lower light transmitting openings are covered with filters that attenuate light having a wavelength in a range of 300 nm to 400 nm in order to control the wavelength of the light. In addition, filters for controlling light intensity are provided between the lenses and the light transmitting openings such that the intensity of the UV light radiated to the substrates of the liquid crystal cell 1 becomes 10 mW/cm$^2$. The above-described filters may be provided anywhere in the optical paths between the lamps and the substrates.

Then, the above-mentioned UV lamps are used to simultaneously radiate UV light of 10 mW/cm² to both surfaces of the liquid crystal cell 1 (the substrates with the above-mentioned mixture injected therebetween) for about 3 minutes. In this case, no photomask is used since the striped transparent electrodes, which hardly transmit light having a wavelength in the vicinity of that of UV light, are provided.

Thereafter, the liquid crystal cell is gradually cooled at a rate of about −5° C./h in the processing chamber 21 of the thermostat 20. When the temperature of the liquid crystal cell becomes about 20° C., UV light of 10 mW/cm² is radiated to both surfaces of the liquid crystal cell for about 10 minutes by using the UV lamps having a peak wavelength in the vicinity of 365 nm.

The configuration of the polymer walls of a liquid crystal panel formed according to the above-described method precisely corresponds to the profile of the pixel portions. An excellent display was obtained when the above-described liquid crystal panel was operated.

Comparative Example

Hereinafter, a comparative example of exposure treatment of a liquid crystal cell using the above-described thermostat will be described.

Figure 7A:
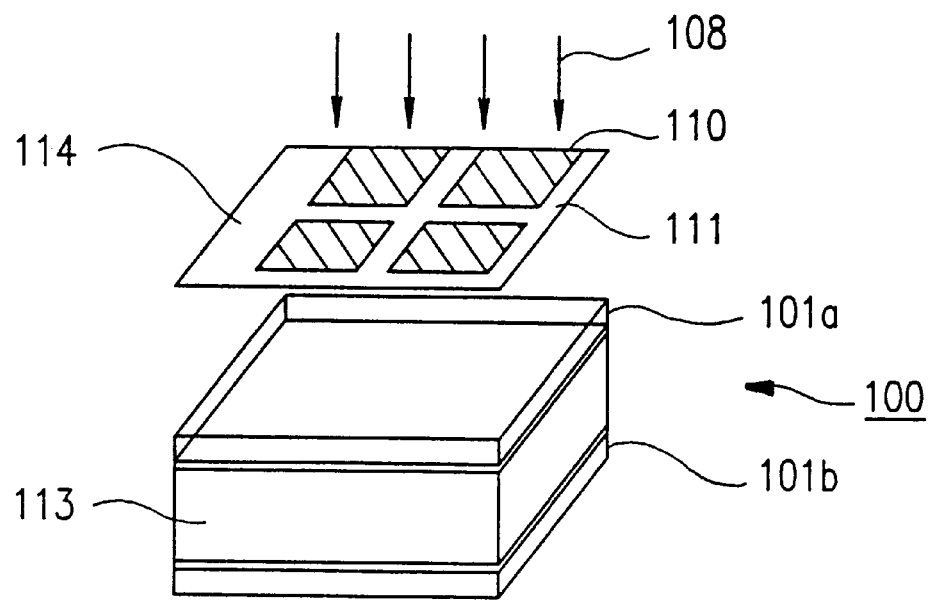
FIGS. 7A and 7B are perspective views for illustrating a method for producing a liquid crystal display device.
Figure 7B:
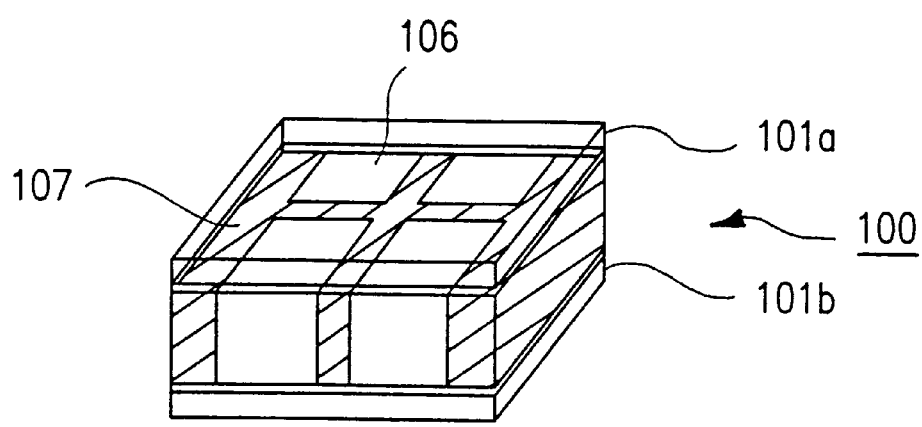

According to this comparative example, the liquid crystal cell is subjected to an exposure treatment according to the method described with reference to FIGS. 7A and 7B, i.e., a method employing a photomask.

First, a liquid crystal cell (a pair of substrates having the above-described mixture injected therebetween) is placed on a hot plate maintained at a temperature of 100° C. and left for about 30 minutes. When the temperature of the surface of the subject was monitored at prescribed positions with a thermocouple, the temperature of the center portion of the subject was about 100° C. whereas the temperature of the portions near the ends of the subject was about 85° C. The phase transition temperature of the used liquid crystal material was about 90° C.

Then, UV light of 10 mW/cm² is radiated to the surfaces of the liquid crystal cell for about 3 minutes via a photomask by using a UV lamp having a peak wavelength in the vicinity of 365 nm, the radiation being conducted one surface at a time. Thereafter, the heater is turned off to dissipate the heat. When the temperature of the liquid crystal cell becomes about 20° C., UV light of 10 mW/cm² is radiated to the liquid crystal cell for about 10 minutes by using the UV lamp having a peak wavelength in the vicinity of 365 nm.

The configuration of the polymer walls of the liquid crystal panel produced according to the above-described method generally matched with the profile of the photomask. However, when the liquid crystal panel was lightened, display defects were generated along the end surfaces of the subject. These display defects are caused by the uneven distribution of the temperature at the end surfaces of the subject because one surface of the subject is directly exposed to the outside air during the exposure treatment.

The heat source of the thermostat described in the above-described examples 1 to 5 is provided inside the thermostat. Alternatively, heated air may be supplied into the thermostat from a heat source apparatus provided outside the thermostat via a duct or the like.

According to the present invention, exposure treatment can be conducted on a subject, i.e., a liquid crystal cell which includes a pair of substrates with a mixture of a liquid crystal material and a photopolymerizable polymer resin injected therebetween, while maintaining the temperature of the subject constant, thereby restraining generation of display defects caused by an uneven distribution of the temperature of a surface of the subject.

Furthermore, exposure treatment can be simultaneously conducted on both surfaces of the above-described liquid crystal cell. Thus, the production efficiency of a liquid crystal display device can be greatly enhanced. Moreover, since a collimated light can be radiated to the surfaces of the liquid crystal cell, a liquid crystal display device having a matrix configuration of polymer walls precisely corresponding to a profile of the pixel portions can be obtained.

According to the present invention, both surfaces of the liquid crystal cell are simultaneously exposed to scattered light. Thus, an area that can be irradiated by one lamp can be spread, thereby reducing the number of lamps and the cost of exposure treatment.

According to the present invention, light for exposure emitted from the light source can be divided into two light beams so as to irradiate both surfaces of the liquid crystal cell. Thus, the number of lamps necessary for irradiating both surfaces of the liquid crystal cell can be reduced. Thus, the cost of the exposure mechanism can be further reduced.

According to the present invention, since the subjects can be sequentially introduced into the processing chamber, the time and trouble expended in replacing the subjects can be minimized. Thus, production efficiency of the liquid crystal display device is greatly enhanced.

According to the present invention, by using UV light as the light source for exposure, the reaction rate and degree of polymerization of the photopolymerizable resin can be enhanced. Thus, a liquid crystal display device with higher display quality can be produced.

According to the present invention, by adding a cooling function to the thermostat, phase separation of the liquid crystal material and the photopolymerizable resin can be promoted. Thus, a liquid crystal display device having polymer walls with precise matrix configuration can be produced.

According to the present invention, the thermostat is provided with a filter for controlling the light intensity and wavelength such that the light from the light source is radiated to the subject placed in the processing chamber via the filter. Accordingly, a reaction rate of the photopolymerizable resin can be adjusted. Thus, a liquid crystal display device with high display quality can be produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thermostat comprising:
   a processing chamber having a constant temperature maintained inside;
   a light source device provided at a prescribed position with respect to the processing chamber; and
   an exposure device directing light emitted from the light source device to a subject placed in the processing chamber, wherein the exposure device includes a light dividing device, and wherein the dividing device divides the light emitted from the light source into two light beams so as to radiate the two divided light beams to a top surface and a bottom surface of the subject placed in the processing chamber.

2. A thermostat according to claim 1, comprising a subject carrying apparatus for sequentially introducing the subject into the processing chamber and sequentially carrying out the subject processed in the processing chamber from the processing chamber.

3. A thermostat according to claim 1, wherein the light source device emits ultraviolet light.

4. A thermostat according to claim 1, further comprising a filter controlling intensity of light and wavelength of light, and wherein the exposure device directs light emitted from the light source device to the subject placed in the processing chamber via the filter.

* * * * *